United States Patent
Song et al.

(10) Patent No.: US 9,799,715 B2
(45) Date of Patent: Oct. 24, 2017

(54) DISPLAY PANEL, MANUFACTURING METHOD THEREFOR, AND DISPLAY APPARATUS

(71) Applicant: BOE TECHNOLOGY GROUP CO., LTD., Beijing (CN)

(72) Inventors: Youngsuk Song, Beijing (CN); Seungjin Choi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/905,893

(22) PCT Filed: Aug. 21, 2015

(86) PCT No.: PCT/CN2015/087815
§ 371 (c)(1),
(2) Date: Jan. 18, 2016

(87) PCT Pub. No.: WO2016/123965
PCT Pub. Date: Aug. 11, 2016

(65) Prior Publication Data
US 2016/0372532 A1    Dec. 22, 2016

(30) Foreign Application Priority Data

Feb. 5, 2015 (CN) .......................... 2015 1 0062271

(51) Int. Cl.
*H01L 27/32* (2006.01)
(52) U.S. Cl.
CPC ........ *H01L 27/3262* (2013.01); *H01L 27/322* (2013.01); *H01L 27/3246* (2013.01); *H01L 27/3258* (2013.01); *H01L 2227/323* (2013.01)
(58) Field of Classification Search
CPC ............... H01L 27/3262; H01L 27/322; H01L 27/3258; H01L 27/3246
See application file for complete search history.

(56) References Cited

U.S. PATENT DOCUMENTS 6,294,313 B1 * 9/2001 Kobayashi .............. G03F 7/095
101/453
8,283,197 B2 * 10/2012 Huang .............. H01L 29/78633
257/E31.122

(Continued)

FOREIGN PATENT DOCUMENTS

CN         101789443 A      7/2010
CN         102331634 A      1/2012

(Continued)

OTHER PUBLICATIONS

International Search Report & Written Opinion Appln. No. PCT/CN2015/087815; dated Nov. 10, 2015.

(Continued)

*Primary Examiner* — William Coleman
(74) *Attorney, Agent, or Firm* — Ladas & Parry LLP

(57) ABSTRACT

A display panel, comprising an array substrate (1) having a plurality of sub pixels (15), wherein the array substrate (1) comprises: a thin film transistor (11), a passivation layer (12) disposed on the thin film transistor, and a color filter layer (13) disposed on the passivation layer, the array substrate further comprises a protection layer (14) which is disposed on the color filter layer (13) and is made of a mixture of metal oxide and resin. In the display panel, the problem that ultraviolet light irradiation onto a thin film transistor affects the transistor performance is solved, the characteristic drift of the thin film transistor is reduced, and the on-off ratio of the thin film transistor is increased, thereby the performance of the thin film transistor is improved. The manufacturing method of the display panel and a display apparatus comprising the display panel are also disclosed.

20 Claims, 3 Drawing Sheets

(56) References Cited

U.S. PATENT DOCUMENTS

| | | | |
|---|---|---|---|
| 9,406,898 B2* | 8/2016 | Yamazaki | H01L 51/5012 |
| 2007/0019126 A1 | 1/2007 | Rhee et al. | |
| 2008/0211997 A1* | 9/2008 | Chen | C08G 73/10 |
| | | | 349/96 |
| 2013/0109770 A1* | 5/2013 | Hatakeyama | C07F 3/003 |
| | | | 521/61 |
| 2014/0204320 A1 | 7/2014 | Yang et al. | |
| 2015/0076467 A1* | 3/2015 | Sasaki | H01L 21/31111 |
| | | | 257/40 |
| 2015/0171116 A1* | 6/2015 | Okazaki | H01L 27/1225 |
| | | | 257/43 |
| 2015/0314941 A1* | 11/2015 | Ramadas | C08J 7/047 |
| | | | 361/679.01 |
| 2016/0276417 A1 | 9/2016 | Huang | |

FOREIGN PATENT DOCUMENTS

| | | |
|---|---|---|
| CN | 103091894 A | 5/2013 |
| CN | 103500754 | 1/2014 |
| CN | 104659066 A | 5/2015 |

OTHER PUBLICATIONS

The Second Chinese Office Action dated May 2, 2017; Appln. No. 201510062271.4.
The Third Chinese Office Action dated Aug. 3, 2017; Appln. No. 201510062271.4.

* cited by examiner

DISPLAY PANEL, MANUFACTURING METHOD THEREFOR, AND DISPLAY APPARATUS

TECHNICAL FIELD

Embodiments of the present disclosure relate to a display panel and its manufacturing method and a display apparatus.

BACKGROUND

Active Matrix/Organic Light Emitting Diode (which is simply referred to as AMOLED) display has many advantages, such as fast response, high contrast, thin and convenient, broad operational range, etc., becoming a new star in display industry. As the current AMOLED display commonly used low-temperature polysilicon (which is simply referred to as LTPS) substrate has complex processes, high cost, difficult to make large size panel and other restrictions, metal oxide thin film transistor (which is simply referred to as TFT) substrate has become a focus on the direction of the study and production of AMOLED.

The bottom emitting type AMOLED display includes an array substrate having a color filter layer and an OLED display structure, the OLED display device needs to be able to produce white light upon irradiation by an excitation light source of ultraviolet light, and then the color filter substrate is irradiated, which causes the AMOLED display to display images of different colors. When ultraviolet light is used as the excitation light source, the ultraviolet light is directly irradiated on TFTs. Because of the poor light stability of the metal oxide TFTs, the output/transfer ability, reliability and other properties of the metal oxide TFTs are adversely affected after being irradiated by light. In particular, the wavelength of ultraviolet light is short, then the characteristic drift of TFT is significant after the TFT is irradiated by ultraviolet light, while the on-off ration gets smaller and the leakage current increases, which directly affect the display performance of the display product.

SUMMARY

Embodiments of the present disclosure provide a display panel, a manufacturing method therefor, and a display apparatus, which solves the problem that ultraviolet light irradiation onto a thin film transistor affects the transistor performance, reduces the characteristic drift of the thin film transistor, and increases the on-off ratio of the thin film transistor, thereby improving the performance of the thin film transistor.

At least one embodiment of the present disclosure provides a display panel which comprises an array substrate having a plurality of sub pixels, wherein the array substrate comprises: a thin film transistor, a passivation layer disposed on the thin film transistor, and a color filter layer disposed on the passivation layer, the array substrate further comprises a protection layer disposed on the color filter layer; the protection layer being made of a mixture of metal oxide and resin.

In one embodiment according to the present disclosure, the display panel further comprises a pixel defining layer located on the surface of the array substrate, and an OLED display structure located on the surface of the pixel defining layer and corresponding to the sub pixels in one-to-one manner, the OLED display structure being a bottom emitting structure, wherein the pixel defining layer is made of a mixture of metal oxide and resin.

In one embodiment according to the present disclosure, the color filter layer is made of a mixture of metal oxide and resin; wherein the color filter layer comprises a plurality of color units of different colors, the color units corresponding to the sub pixels in one-to-one manner.

In one embodiment according to the present disclosure, the metal oxide is nano metal oxide.

In one embodiment according to the present disclosure, the nano metal oxide comprises at least one of nano titanium dioxide, nano manganese dioxide, nano iron oxide, and nano magnesium oxide.

In one embodiment according to the present disclosure, the mass ratio of the metal oxide in the mixture is 5~15%.

In one embodiment according to the present disclosure, the thickness of the protection layer is 1~4 μm.

In one embodiment according to the present disclosure, the thickness of the pixel defining layer is 1~4 μm.

In one embodiment according to the present disclosure, the thickness of the color filter layer is 1~4 μm.

At least one embodiment of the present disclosure provides a method for manufacturing a display panel, the method comprises:

forming a thin film transistor on a base substrate;
forming a passivation layer on the thin film transistor;
forming a color filter layer on the passivation layer; and
forming a protection layer on the color filter layer by using a mixture of metal oxide and resin.

In one embodiment according to the present disclosure, the method further comprises:

forming a pixel defining layer on the protection layer by using a mixture of metal oxide and resin; and
forming an OLED display structure on the pixel defining layer; wherein the OLED display structure being a bottom emitting structure.

In one embodiment according to the present disclosure, forming the color filter layer on the passivation layer comprises forming the color filter layer on the passivation layer by using a mixture of metal oxide and resin.

At least one embodiment of the present disclosure provides a display apparatus comprising any of the display panels described above.

In the display panel and its manufacturing method and the display apparatus according to embodiments of the present disclosure, a protection layer is formed on a color filter layer of the display panel by using a mixture of metal oxide and resin, because transmittance of the ultraviolet light in metal oxide is zero, the mixture of metal oxide and resin can block the ultraviolet light, and the protection layer can prevent the ultraviolet light from irradiating onto the thin film transistor when performing irradiation with the ultraviolet light as excitation light source, which solves the problem that ultraviolet light irradiation onto a thin film transistor affects the transistor performance, reduces the characteristic drift of the thin film transistor, and increases the on-off ratio of the thin film transistor, thereby improving the performance of the thin film transistor.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Figure 1:
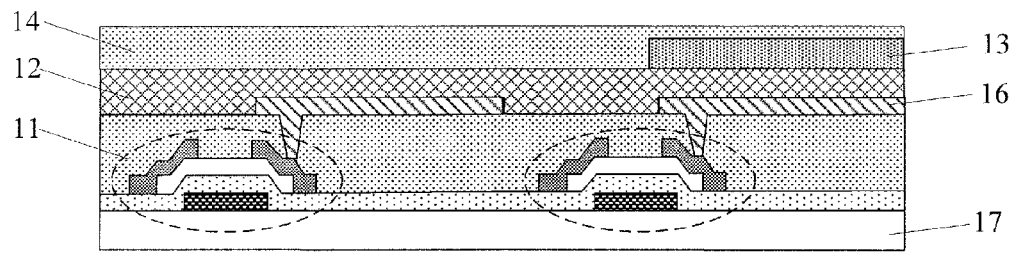
FIG. 1 is a schematic structural diagram of a display panel according to one embodiment of the present disclosure.

At least one embodiment of the present disclosure provides a display panel. As illustrated in FIG. 1, the display panel comprises an array substrate having a plurality of sub pixels, wherein the array substrate comprises: a thin film transistor 11, a passivation layer 12 disposed on the thin film transistor 11, and a color filter layer 13 and a protection layer 14 disposed on the passivation layer 12, wherein:

the protection layer 14 is disposed on the color filter layer 13.

the protection layer 14 is made of a mixture of metal oxide and resin.

Figure 2:
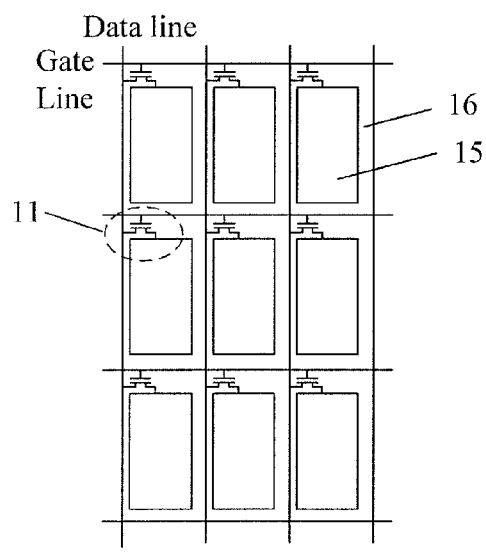
FIG. 2 is a top view of a schematic structural diagram of an array substrate in traditional arts.

It is needed to explain that, on the array substrate (whose top view as illustrated in FIG. 2), a plurality of sub pixels 15 are defined by a plurality of gate lines and data lines crossing each other. A thin film transistor 11 (simply referred to as TFT) is disposed in each sub pixel 15. Thin film transistor 11 is a kind of semiconductor unit with switching characteristics, which can be either top gate type or bottom gate type, and this is not limited herein. As illustrated in FIG. 1, the array substrate can also comprise a pixel electrode layer 16.

In the present disclosure, the top gate type and bottom gate type are defined by the position of the gate electrode and the drain electrode and the source electrode relative to the base substrate. For example, with reference to FIG. 4, it is a thin film transistor 11 of bottom gate type when the gate electrode 111 is closer to the base substrate 17 of the array substrate than the drain electrode 112 and the source electrode 113. It is a thin film transistor 11 of top gate type when the drain electrode 112 and the source electrode 113 are closer to the base substrate 17 of the array substrate than the gate electrode 111, the specific structure of the thin film transistor 11 of the top gate type is not shown in the drawings.

Figure 4:
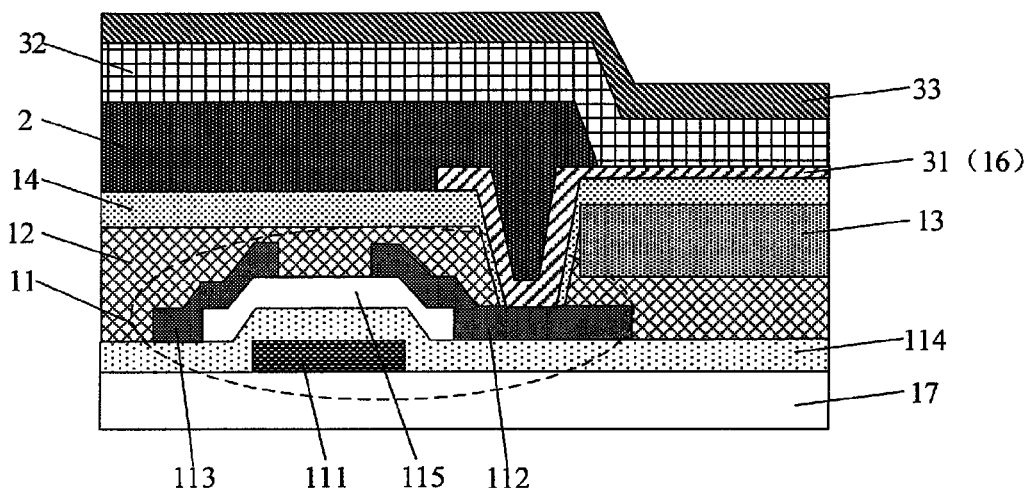
FIG. 4 is a schematic structural diagram of a display panel according to yet another embodiment of the present disclosure.

Embodiments of the present disclosure will be described in the following with the thin film transistor 11 being the thin film transistor of bottom gate type as an example. With reference to FIG. 4, the thin film transistor 11 also comprises a gate insulating layer 114 and an active layer 115.

In embodiments of the present disclosure, the protection layer of the display panel is made of a mixture of metal oxide and resin. Because transmittance of the ultraviolet light in metal oxide is zero, the mixture of metal oxide and resin can block the ultraviolet light. The protection layer can effectively prevent the ultraviolet light from irradiating onto the thin film transistor when using the ultraviolet light as an excitation light source in the display panel, which guaranties the performance of the thin film transistor. Compared with the thin film transistor in the display panel of prior arts, it can effectively avoid the problem that the on-off ratio of the thin film transistor becomes smaller and the leakage current increases, which can guaranty the display performance of the display device.

In the display panel according to embodiments of the present disclosure, a protection layer is formed on the color filter layer of the display panel by using a mixture of metal oxide and resin, as transmittance of the ultraviolet light in metal oxide is zero, the mixture of metal oxide and resin can block the ultraviolet light, and the protection layer can prevent the ultraviolet light from irradiating onto the thin film transistor when performing irradiation with the ultraviolet light as an excitation light source, which solves the problem that ultraviolet light irradiation onto a thin film transistor affects the transistor performance, reduces the characteristic drift of the thin film transistor, and increases the on-off ratio of the thin film transistor, thereby improving the performance of the thin film transistor.

Figure 3:
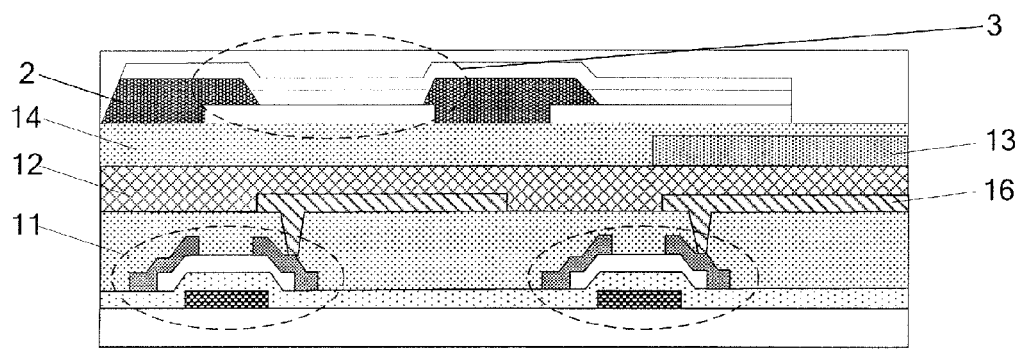
FIG. 3 is a schematic structural diagram of a display panel according to another embodiment of the present disclosure.

For example, as illustrated in FIG. 3, the display panel further comprises a pixel defining layer 2 located on the surface of the array substrate, and an OLED display structure 3 located on the surface of the pixel defining layer 2 and corresponding to the sub pixels in one-to-one manner, the OLED display structure being a bottom emitting structure, wherein the pixel defining layer 2 of the display panel is made of a mixture of metal oxide and resin.

For example, the color filter layer is made of a mixture of metal oxide and resin; wherein the color filter layer 13 comprises a plurality of color units of different colors, the color units corresponding to the sub pixels in one-to-one manner.

For example, the metal oxide is nano metal oxide.

For example, the nano metal oxide can comprise at least one of nano titanium dioxide, nano manganese dioxide, nano iron oxide, and nano magnesium oxide.

It is needed to explain that, the mass ratio of the metal oxide in the mixture can be 5~15%. Thus, the ultraviolet light can be effectively blocked, and meanwhile the metal oxide can be uniformly dispersed in the resin. In order to make the metal oxide uniformly dispersed in the resin, dispersants can be used to reduce degree of aggregation of the metal oxide in the resin. In the present disclosure, the optional dispersants comprise fatty acids, aliphatic amides, esters, paraffin wax or low molecular wax. When dispersing the metal oxide in the resin, metal oxide, dispersants and resin can be placed in a high speed mixer to be mixed completely, so that the metal oxide can be uniformly dispersed in the resin. Of course, those skilled in the art can also adopt other dispersants and dispersing methods, and limitations are not imposed thereto in the present application.

For example, in forming the protection layer, the pixel defining layer or the color filter layer, metal oxide of nano-scale, such as at least one of nano titanium dioxide, nano manganese dioxide, nano iron oxide, and nano magnesium oxide and so on, can be uniformly dispersed in the resin by means of dispersants. Because transmittance of the ultraviolet light in nano titanium dioxide, nano manganese dioxide, nano iron oxide, or nano magnesium oxide is zero, it is better ensured that the ultraviolet light is blocked by the protection layer, the pixel defining layer and the color filter layer.

For example, with reference to FIG. 4, the OLED display structure includes:

a first electrode 31, an organic material function layer 32 and a second electrode 33 disposed on the pixel defining layer 2 in sequence.

For example, the organic material function layer 32 includes a hole injection layer, a hole transport layer, an organic light emitting layer, an electron transport layer, and an electron injection layer (not illustrated in the figure).

The first electrode is connected to the drain electrode of the thin film transistor through vias on the passivation layer and vias on the protection layer.

Vias on the passivation layer 12 and vias on the protection layer correspond to each other.

For example, in order to simplify the manufacturing process, vias can be provided on the passivation layer and the protection layer, such that the first electrode can be connected to the drain electrode of the thin film transistor in the sub pixels through the above vias. In this way, the first electrode can also be used as the pixel electrode on the array substrate, which greatly reduces the production cost.

For the bottom emission type AMOLED display panel, the first electrode can be made of transparent conductive materials, such as indium tin oxide (ITO) or indium zinc oxide (IZO). The second electrode can be made of metal materials. When the second electrode is made of at least one of metallic aluminum or metallic silver, due to the high reflectivity of metallic aluminum or metallic silver, the display panel can be used as a mirror when the display panel is not in operation. Thus it is capable of manufacturing a mirror display.

For example, the thickness of the protection layer 14 is 1~4 µm.

The thickness of the pixel defining layer 2 is 1~4 µm.

The thickness of the color filter layer 13 is 1~4 µm.

It is needed to explain that, each of the thicknesses of the protection layer, the pixel electrode layer and the color filter layer is set to 1~4 µm in this embodiment, which can ensure that the thickness of the final display panel is not too great while the functions of respective film layer of the protection layer, the pixel defining layer and the color filter layer are realized, so that the ultra-thin design of the display panel is possible.

Since the above OLED display structure can emit white light, the organic light emitting layer of the OLED display structure can include a red organic light emitting layer (R), a green organic light emitting layer (G) and a blue organic light emitting layer (B), which are located on the surface of the hole transport layer and sequentially stacked in any order. For example, by means of an evaporation process, a layer of red organic light emitting layer is deposited on the surface of the hole transport layer; and then a layer of green organic light emitting layer is deposited on the surface of the red organic light emitting layer; and next, a layer of blue organic light emitting layer is deposited on the surface of the green organic light emitting layer. Similarly, organic light emitting layers in other stack order can also be formed, which is not elaborated herein.

In addition, the organic light emitting layer of the OLED display structure can also include: a red organic light emitting layer (R), a green organic light emitting layer (G) and a blue organic light emitting layer (B) which are disposed in the same layer and arranged in any order. In particular, the red organic light emitting layer (R), the green organic light emitting layer (G) and the blue organic light emitting layer (B) of the strip shape are separately formed through three mask exposure processes by using the same mask. In addition to the first mask exposure process, the mask is required to be displaced in the later two mask exposure processes to avoid the overlapping of different organic light emitting layers.

For example, while the protection layer is made of a mixture of metal oxide and resin, the pixel defining layer is also made of a mixture of metal oxide and resin, which can further prevent the drain electrode region of the thin film transistor connected to the first electrode from being irradiated by the ultraviolet light, which ensures the on-off ratio of the thin film transistor and the magnitude of the leakage current be within a proper range, so as to improve the performance of the thin film transistor. Further, the color filter layer is also formed by the mixture of metal oxide and resin, which can prevent a part of the light source irradiating into the OLED display structure from irradiating onto the thin film transistor. At the same time, it can be ensured that light transmitting through the color filter layer comprises only visible light without ultraviolet light. Compared with the light transmitting through the color filter layer being mixed up with visible light and ultraviolet in traditional arts, the display effect of the display device according to the embodiments of the present disclosure is far better than that of the display device in traditional arts, which has a better prospect in the market.

In the display panel according to embodiments of the present disclosure, the protection layer is formed on the color filter layer of the display panel by using a mixture of metal oxide and resin, because transmittance of the ultraviolet light in metal oxide is zero, the mixture of metal oxide and resin can block the ultraviolet light, and the protection layer can prevent the ultraviolet light from irradiating onto the thin film transistor when performing irradiation with the ultraviolet light as an excitation light source, which solves the problem that ultraviolet light irradiation onto a thin film transistor affects the transistor performance, reduces the characteristic drift of the thin film transistor, and increases the on-off ratio of the thin film transistor, thereby improving the performance of the thin film transistor.

Figure 5:
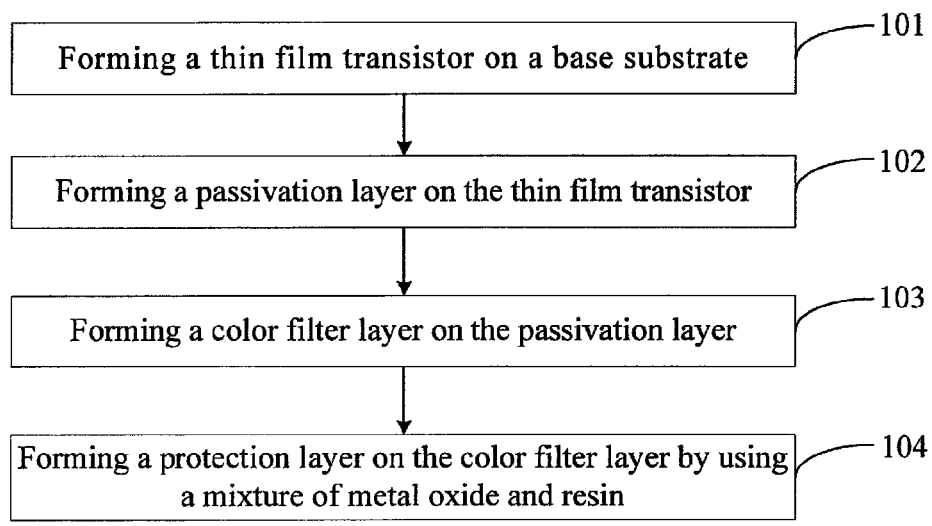
FIG. 5 is a flow chart of a manufacturing method of a display panel according to one embodiment of the present disclosure.

At least one embodiment of the present disclosure provides a manufacturing method of a display panel, with reference to FIG. 5, the method comprises of the following steps:

101, forming a thin film transistor on a base substrate.

For example, a gate electrode of the thin film transistor, a gate electrode insulating layer, source and drain metal layer, a source electrode of the thin film transistor, a drain electrode of the thin film transistor, an insulating layer, and a pixel electrode connected to the drain electrode of the thin film transistor through vias can be sequentially formed on the surface of the base substrate made of glass through patterning process.

It is needed to explain that, the patterning process can refer to a process including a lithography process, or, including a lithography process and an etching step, as well as other processes for forming a predetermined pattern, including printing, ink jetting, and the like. The lithography process refers to the process of forming a pattern with use of photoresist, mask plate, exposure machine, etc., including film formation, exposure, development, and other process procedures. The corresponding patterning process can be selected according to the structure to be formed in the embodiments of the present disclosure.

102, forming a passivation layer n the thin film transistor.

For example, a passivation layer with thickness from 1000 Å to 6000 Å can be deposited on the thin film transistor by using chemical vapor phase deposition or magnetron sputtering method, and the used material is usually silicon nitride or transparent organic resin.

103, forming a color filter layer on the passivation layer.

104, forming a protection layer on the color filter layer by using a mixture of metal oxide and resin.

For example, a film layer of mixture of metal oxide and resin with a thickness of 1~4 μm can be coated on the surface of the color filter layer using a coating method, and then a protection layer is formed by a patterning process. The metal oxide can be nano metal oxide, which can include nano titanium dioxide, nano manganese dioxide, nano iron oxide, nano magnesium oxide, and so on.

In the manufacturing method of the display panel according to embodiments of the present disclosure, the protection layer is formed on the color filter layer of the display panel by using a mixture of metal oxide and resin, because transmittance of the ultraviolet light in metal oxide is zero, the mixture of metal oxide and resin can block the ultraviolet light, and the protection layer can prevent the ultraviolet light from irradiating onto the thin film transistor when performing irradiation with the ultraviolet light as an excitation light source, which solves the problem that ultraviolet light irradiation onto a thin film transistor affects the transistor performance, reduces the characteristic drift of the thin film transistor, and increases the on-off ratio of the thin film transistor, thereby improving the performance of the thin film transistor.

Figure 6:
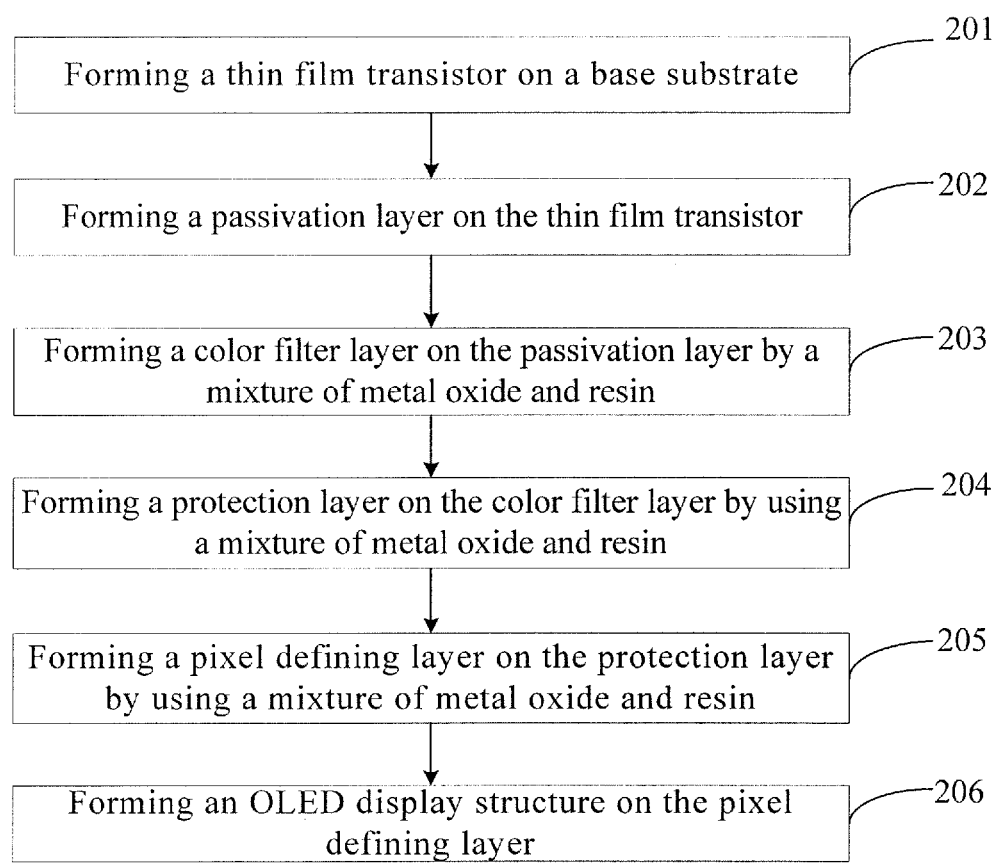
FIG. 6 is a flow chart of the manufacturing method of a display panel according to another embodiment of the present disclosure.

One embodiment of the present disclosure provides a manufacturing method of a display panel, with reference to FIG. 6, the method comprises the following steps:

201, forming a thin film transistor on a base substrate.

202, forming a passivation layer on the thin film transistor.

203, forming a color filter layer on the passivation layer using a mixture of metal oxide and resin.

For example, a film layer of mixture of metal oxide and resin with a thickness of 1~4 μm can be coated on the surface of the passivation layer using a coating method, and then a color filter layer is formed by a patterning process. The metal oxide can be nano metal oxide, which can include nano titanium dioxide, nano manganese dioxide, nano iron oxide, nano magnesium oxide, and so on.

204, forming a protection layer on the color filter layer using a mixture of metal oxide and resin.

205, forming a pixel defining layer on the protection layer using a mixture of metal oxide and resin.

For example, a film layer of mixture of metal oxide and resin with a thickness of 1~4 μm can be coated on the surface of the protection layer using a coating method, and then a pixel defining layer is formed by a patterning process. The metal oxide can be nano metal oxide, which can include nano titanium dioxide, nano manganese dioxide, nano iron oxide, nano magnesium oxide, and so on.

206, forming an OLED display structure on the pixel defining layer.

The above OLED display structure is a bottom emitting structure.

For example, a first electrode can be formed on the pixel defining layer by using Indium tin oxide (which is simply referred to as ITO) or Indium-doped zinc oxide (which is simply referred to as IZO), and then a hole injection layer, a hole transport layer, an organic light emitting layer, an electron transport layer, and an electron injection layer are formed in sequence on the surface of the first electrode by means of an evaporation process. Next, through coating or sputtering process, a whole metal layer is produced on the structure surface formed after the completion of the above steps, in order to constitute a second electrode of the OLED display structure, wherein metal material for the second electrode can be metallic aluminum or metallic silver.

It is needed to explain that, the flow charts in the present embodiment which are the same as the steps in the above embodiment can be referred to the description in the embodiment mentioned above, which is not repeated herein.

In the manufacturing method of the display panel according to embodiments of the present disclosure, the protection layer is formed on the color filter layer of the display panel by using a mixture of metal oxide and resin, because transmittance of the ultraviolet light in metal oxide is zero, the mixture of metal oxide and resin can block the ultraviolet light, and the protection layer can prevent the ultraviolet light from irradiating onto the thin film transistor when performing irradiation with the ultraviolet light as an excitation light source, which solves the problem that ultraviolet light irradiation onto a thin film transistor affects the transistor performance, reduces the characteristic drift of the thin film transistor, and increases the on-off ratio of the thin film transistor, thereby improving the performance of the thin film transistor.

At least one embodiment of the present disclosure provides a display apparatus including any of the display panels provided in above embodiments, and the display apparatus can be: a mobile phone, a tablet computer, a television, a laptop, a digital photo frame, a navigation device and any other products or components with display function.

In the display apparatus according to embodiments of the present disclosure, the protection layer is formed on the color filter layer of the display panel of the display apparatus by using a mixture of metal oxide and resin, because transmittance of the ultraviolet light in metal oxide is zero, the mixture of metal oxide and resin can block the ultraviolet light, and the protection layer can prevent the ultraviolet light from irradiating onto the thin film transistor when performing irradiation with the ultraviolet light as an excitation light source, which solves the problem that ultraviolet light irradiation onto a thin film transistor affects the transistor performance, reduces the characteristic drift of the thin film transistor, and increases the on-off ratio of the thin film transistor, thereby improving the performance of the thin film transistor. Thus, the display effect of the screen of the display device can be improved.

What are described above is related to the illustrative embodiments of the disclosure only and not limitative to the scope of the disclosure, the scopes of the disclosure are defined by the accompanying claims.

This disclosure claims the benefit of Chinese patent application No. 201510062271.4, filed Feb. 5, 2015, the disclosure of which is hereby incorporated herein by reference in its entirety.

The invention claimed is:

1. A display panel, comprising an array substrate having a plurality of sub pixels, wherein the array substrate comprises: a thin film transistor, a passivation layer disposed on the thin film transistor, and a color filter layer disposed on the passivation layer, the array substrate further comprises a protection layer which is disposed on the color filter layer and is made of a mixture of metal oxide and resin, the protection layer is disposed over the passivation layer and the color filter and in contact with the passivation layer and the color filter layer.

2. The display panel according to claim 1, further comprising a pixel defining layer disposed on the surface of the array substrate, and an OLED display structure located on the surface of the pixel defining layer and corresponding to the sub pixels in one-to-one manner, the OLED display structure being a bottom emitting structure,
wherein the pixel defining layer is made of a mixture of metal oxide and resin.

3. The display panel according to claim 1, wherein the color filter layer is made of a mixture of metal oxide and resin; and the color filter layer comprises a plurality of color units of different colors, the color units corresponding to the sub pixels in one-to-one manner.

4. The display panel according to claim 1, wherein the metal oxide is nano metal oxide.

5. The display panel according to claim 1, wherein the mass ratio of the metal oxide in the mixture is 5~15%.

6. The display panel according to claim 1, wherein the protection layer has a thickness of 1~4 μm.

7. A display apparatus, comprising the display panel according to claim 1.

8. The display panel according to claim 2, wherein the pixel defining layer has a thickness of 1~4 μm.

9. The display panel according to claim 2, wherein the color filter layer is made of a mixture of metal oxide and resin; and the color filter layer comprises a plurality of color units of different colors, the color units corresponding to the sub pixels in one-to-one manner.

10. The display panel according to claim 3, wherein the color filter layer has a thickness of 1~4 μm.

11. The display panel according to claim 4, wherein the nano metal oxide comprises at least one of nano titanium dioxide, nano manganese dioxide, nano iron oxide, and nano magnesium oxide.

12. A method for manufacturing a display panel, comprising:
forming a thin film transistor on a base substrate;
forming a passivation layer on the thin film transistor;
forming a color filter layer on the passivation layer; and
forming a protection layer on the color filter layer by using a mixture of metal oxide and resin, wherein the protection layer is disposed over the passivation layer and the color filter and in contact with the passivation layer and the color filter layer.

13. The method according to claim 12, further comprising:
forming a pixel defining layer on the protection layer by using a mixture of metal oxide and resin; and
forming an OLED display structure on the pixel defining layer; wherein the OLED display structure is a bottom emitting structure.

14. The method according to claim 12, wherein forming a color filter layer on the passivation layer comprises forming the color filter layer on the passivation layer by using a mixture of metal oxide and resin.

15. The method according to claim 12, wherein the metal oxide is nano metal oxide.

16. The method according to claim 12, wherein the mass ratio of the metal oxide in the mixture is 5~15%.

17. The method according to claim 12, wherein the pixel defining layer has a thickness of 1~4 μm.

18. The method according to claim 12, wherein the protection layer has a thickness of 1~4 μm.

19. The method according to claim 12, wherein the color filter layer has a thickness of 1~4 μm.

20. The method according to claim 15, wherein the nano metal oxide comprises at least one of nano titanium dioxide, nano manganese dioxide, nano iron oxide, and nano magnesium oxide.

* * * * *